United States Patent
Lee et al.

(10) Patent No.: US 9,947,694 B2
(45) Date of Patent: Apr. 17, 2018

(54) STRUCTURE OF SIGNAL LINES IN THE FAN-OUT REGION OF AN ARRAY SUBSTRATE

(71) Applicant: Samsung Display Co., Ltd., Yongin-si (KR)

(72) Inventors: Sohyun Lee, Yongin-si (KR); Sowoon Kim, Yongin-si (KR); Haeryeong Park, Yongin-si (KR); Suah Oh, Yongin-si (KR); Wando Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/075,345

(22) Filed: Mar. 21, 2016

(65) Prior Publication Data

US 2017/0047356 A1    Feb. 16, 2017

(30) Foreign Application Priority Data

Aug. 13, 2015 (KR) .................. 10-2015-0114553

(51) Int. Cl.
*H01L 27/12* (2006.01)
(52) U.S. Cl.
CPC .................. *H01L 27/1244* (2013.01)
(58) Field of Classification Search
CPC .................................................. H01L 27/1244
See application file for complete search history.

(56) References Cited

U.S. PATENT DOCUMENTS

| | | | |
|---|---|---|---|
| 5,870,163 A | 2/1999 | Watanabe et al. | |
| 6,104,465 A * | 8/2000 | Na | G02F 1/1345 349/152 |
| 2003/0086048 A1 * | 5/2003 | Ukita | G02F 1/1345 349/149 |
| 2007/0002243 A1 * | 1/2007 | Kim | G02F 1/13452 349/139 |
| 2007/0052895 A1 * | 3/2007 | Chen | G02F 1/1345 349/139 |
| 2008/0203391 A1 | 8/2008 | Kim et al. | |
| 2014/0377690 A1 * | 12/2014 | Zheng | G03F 1/38 430/5 |
| 2015/0009438 A1 | 1/2015 | Du et al. | |
| 2015/0108480 A1 * | 4/2015 | Xu | H01L 22/22 257/59 |

FOREIGN PATENT DOCUMENTS

| KR | 10-2008-0044503 | 5/2008 |
|---|---|---|
| KR | 10-2008-0076519 | 8/2008 |

* cited by examiner

*Primary Examiner* — Erik Kielin
(74) *Attorney, Agent, or Firm* — H.C. Park & Associates, PLC (57) ABSTRACT

An array substrate includes a plurality of signal lines disposed in a display area; a plurality of signal pads disposed in a non-display area; and a fan-out portion disposed in the non-display. The fan-out portion includes a plurality of fan-out lines connecting the plurality of signal lines to the plurality of signal pads. Each of the plurality of fan-out lines includes a pattern electrically connected to a corresponding signal pad of the plurality of signal pads, and a straight portion electrically connected to a corresponding signal line of the plurality of signal lines. The pattern includes a first conductive layer. The straight portion includes the first conductive layer and a second conductive layer disposed on the first conductive layer.

20 Claims, 7 Drawing Sheets

STRUCTURE OF SIGNAL LINES IN THE FAN-OUT REGION OF AN ARRAY SUBSTRATE

CROSS-REFERENCE TO RELATED APPLICATION

This application claims priority from and the benefit of Korean Patent Application No. 10-2015-0114553, filed on Aug. 13, 2015, which is hereby incorporated by reference for all purposes as if fully set forth herein.

BACKGROUND

Field

One or more exemplary embodiments relate to electronic devices, and, more particularly, to an array substrate of an electronic device.

Discussion of the Background

A flat panel-type display apparatus typically includes two substrates with image displaying members, such as liquid crystal molecules, light-emitting devices, electrophoretic particles, etc., disposed between the two substrates. One of the two substrates may be an array substrate including a display area and a peripheral area outside the display area. The display area may include signal lines (e.g., gate lines and data lines) and pixel electrodes arranged in a matrix formation. Ends of the signal lines may extend into the peripheral area to connect to another layer or an external driving circuit. The signal lines may include a fan-out portion in which intervals between the signals lines narrow toward the ends. As the peripheral area (e.g., non-display area) of a flat panel-type display is reduced, an area of the fan-out portion may also be reduced, which, in turn, may cause increased variation in resistances of the corresponding wires in the fan-out portion.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide an array substrate configured to minimize a variation in resistances of fan-out lines in a fan-out portion of the array substrate.

Additional aspects will be set forth in the detailed description which follows and, in part, will be apparent from the disclosure, or may be learned by practice of the inventive concept.

According to one or more exemplary embodiments, an array substrate includes a plurality of signal lines disposed in a display area; a plurality of signal pads disposed in a non-display area; and a fan-out portion disposed in the non-display. The fan-out portion includes a plurality of fan-out lines connecting the plurality of signal lines to the plurality of signal pads. Each of the plurality of fan-out lines includes a pattern electrically connected to a corresponding signal pad of the plurality of signal pads, and a straight portion electrically connected to a corresponding signal line of the plurality of signal lines. The pattern includes a first conductive layer. The straight portion includes the first conductive layer and a second conductive layer disposed on the first conductive layer.

According to one or more exemplary embodiments, an array substrate includes a plurality of signal lines disposed in a display area; a plurality of signal pads disposed in a non-display area; and a fan-out portion disposed in the non-display area. The fan-out portion includes a plurality of fan-out lines connecting the plurality of signal lines to the plurality of signal pads. Each of the plurality of fan-out lines includes: a pattern electrically connected to a corresponding signal pad of the plurality of signal pads; a straight portion electrically connected to a corresponding signal line of the plurality of signal lines; and a first contact disposed at a boundary between the pattern and the straight portion. A distance between the first contact and the corresponding signal pad reduces with increasing distance from a center portion of the fan-out portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
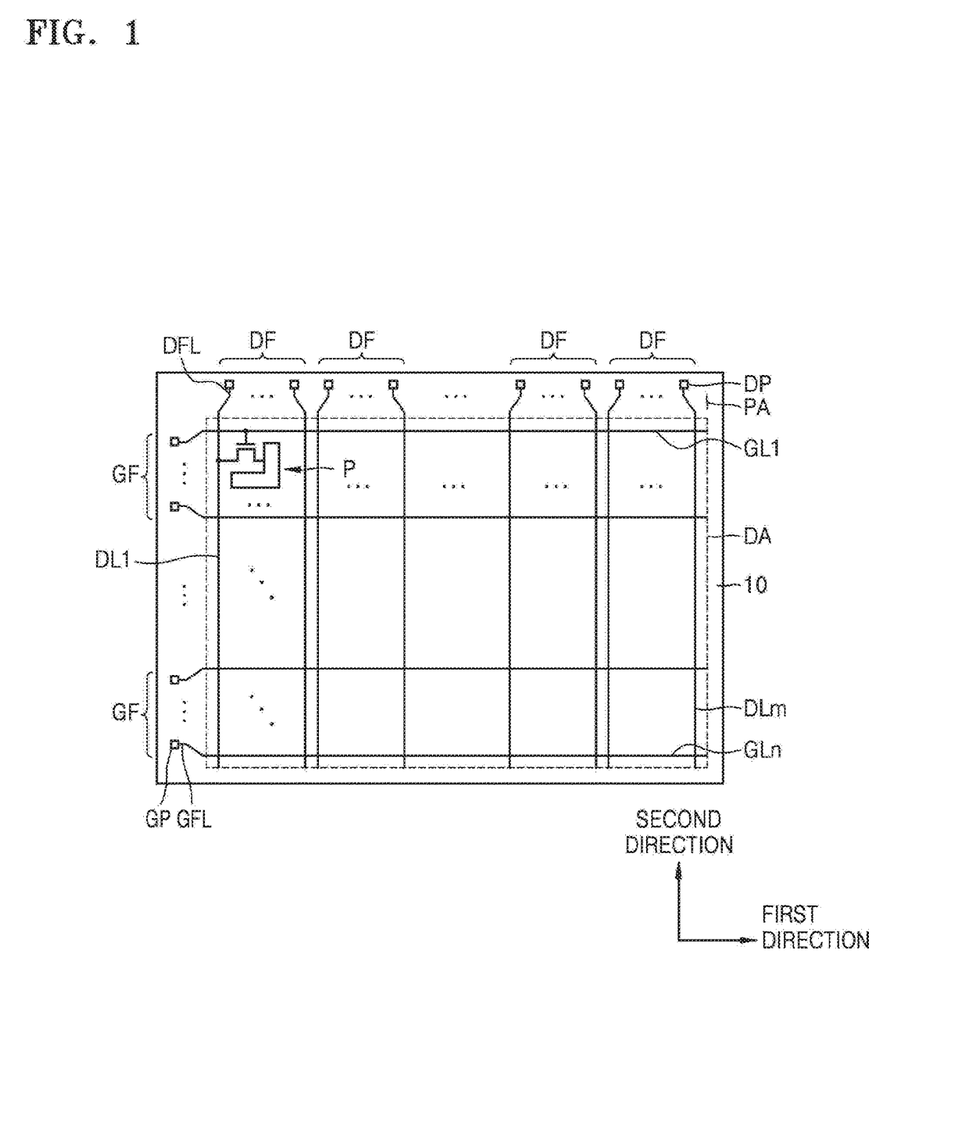
FIG. 1 is a schematic plan view of an array substrate, according to one or more example embodiments.
Figure 2:
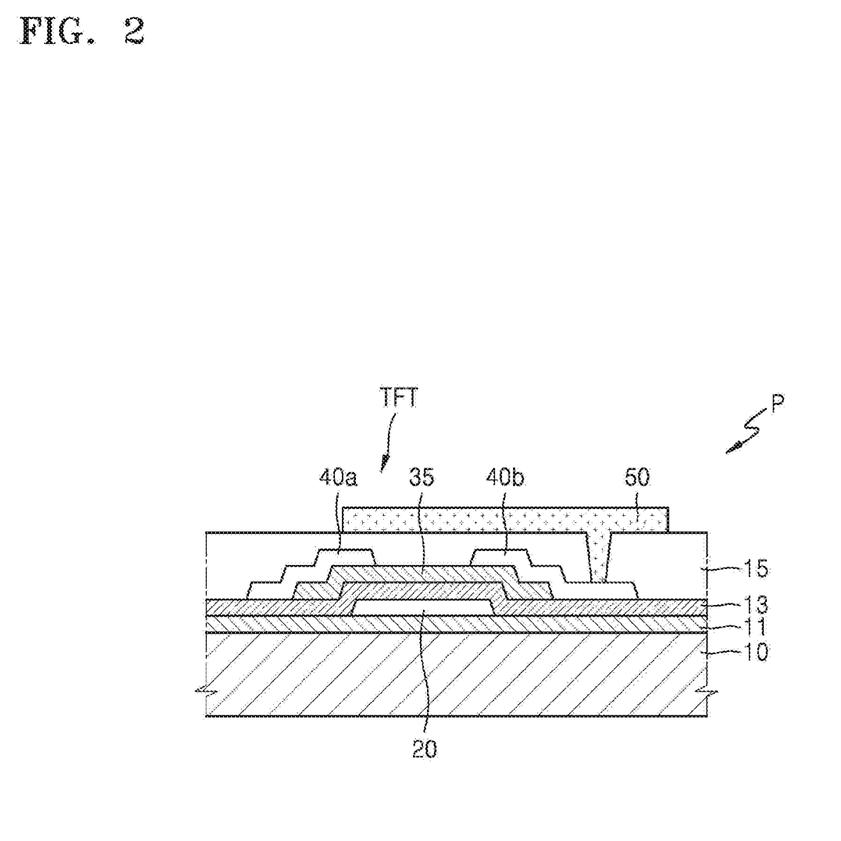
FIG. 2 is a schematic cross-sectional view of a pixel of the array substrate of FIG. 1, according to one or more exemplary embodiments.

FIG. 1 is a schematic plan view of an array substrate, according to one or more exemplary embodiments. FIG. 2 is a schematic cross-sectional view of a pixel of the array substrate of FIG. 1, according to one or more exemplary embodiments.

Referring to FIG. 1, the array substrate 10 (hereinafter, referred to as substrate 10) may include a display area DA and a peripheral area PA outside (e.g., around) the display area DA. A buffer layer 11 may be formed on the substrate 10. The display area DA includes a plurality of gate lines GL1 to GLn extending in a first direction, a plurality of data lines DL1 to DLm extending in a second direction crossing the first direction, and a plurality of pixels P electrically connected to the gate lines and the data lines.

Referring to FIG. 2, each of the pixels P may include a thin film transistor TFT and a pixel electrode 50. The thin film transistor TFT may include a gate electrode 20 formed on the substrate 10, an active layer 35 on the gate electrode 20, and a source electrode 40a and a drain electrode 40b formed on the active layer 35. A first ohmic contact layer (not shown) may be further disposed between the active layer 35 and the source electrode 40a, and a second ohmic contact layer (not shown) may be disposed between the active layer 35 and the drain electrode 40b. A first insulating layer 13 may be disposed between the gate electrode 20 and the active layer 35, and a second insulating layer 15 may be disposed between the source electrode 40a and the drain electrodes 40b and the pixel electrode 50. The gate electrode 20 may be connected to a corresponding gate line of the gate lines GL1 to GLn. The source electrode 40a may be connected to a corresponding data line of the data lines DL1 to DLm. The drain electrode 40b may be connected to the pixel electrode 50.

Adverting back to FIG. 1, the peripheral area PA may include a plurality of data fan-out portions DF and a plurality of gate fan-out portions GF. Each of the data fan-out portions DF includes a plurality of data fan-out lines DFL. An end of each of the data fan-out lines DFL is electrically connected to a data pad DP corresponding to the data fan-out line DFL, and the other end is electrically connected to a data line of the data lines DL1 to DLm corresponding to the data fan-out line DFL. An external device (not illustrated), such as a driving integrated circuit, may be electrically connected to the data pad DP. For example, a driving integrated circuit including a data driver may be bonded to the data pads DP as a chip-on-glass (COG)-type driving integrated circuit, and may be mounted on the peripheral area PA of the substrate 10. The data fan-out lines DFL in each of the data fan-out portions DF become more adjacent to each other from a data line DL side toward a data pad DP side.

Each of the gate fan-out portions GF includes a plurality of gate fan-out lines GFL. An end of each of the gate fan-out lines GFL is electrically connected to a gate pad GP corresponding thereto, and the other end of each gate fan-out line GFL is electrically connected to a corresponding gate line of the gate lines GL1 to GLn. An external device (not illustrated), such as a driving integrated circuit, may be electrically connected to the gate pads GP. For example, a driving integrated circuit including a gate driver may be bonded to the gate pads GP in a COG-type driving integrated circuit, and may be mounted on the peripheral area PA of the substrate 10. The gate fan-out lines GFL in each of the gate fan-out portions GF may become more adjacent to each other from a gate line GL side toward a gate pad GP side.

The data fan-out lines DFL and the gate fan-out lines GFL may include a first conductive layer formed at the same layer and including the same material as the gate lines GL1 to GLn. In some parts of the data fan-out lines DFL and the gate fan-out lines GFL, a second conductive layer may overlap the first conductive layer. The second conductive layer may be formed at the same layer and including the same material as the data lines DL1 to DLm. In addition, the gate fan-out portions GF and the data fan-out portions DF may have similar structures to each other, and, as such, a data fan-out portion DF will be described in more detail as an exemplary of the gate fan-out portions GF and the data fan-out portions DF.

Figure 3:
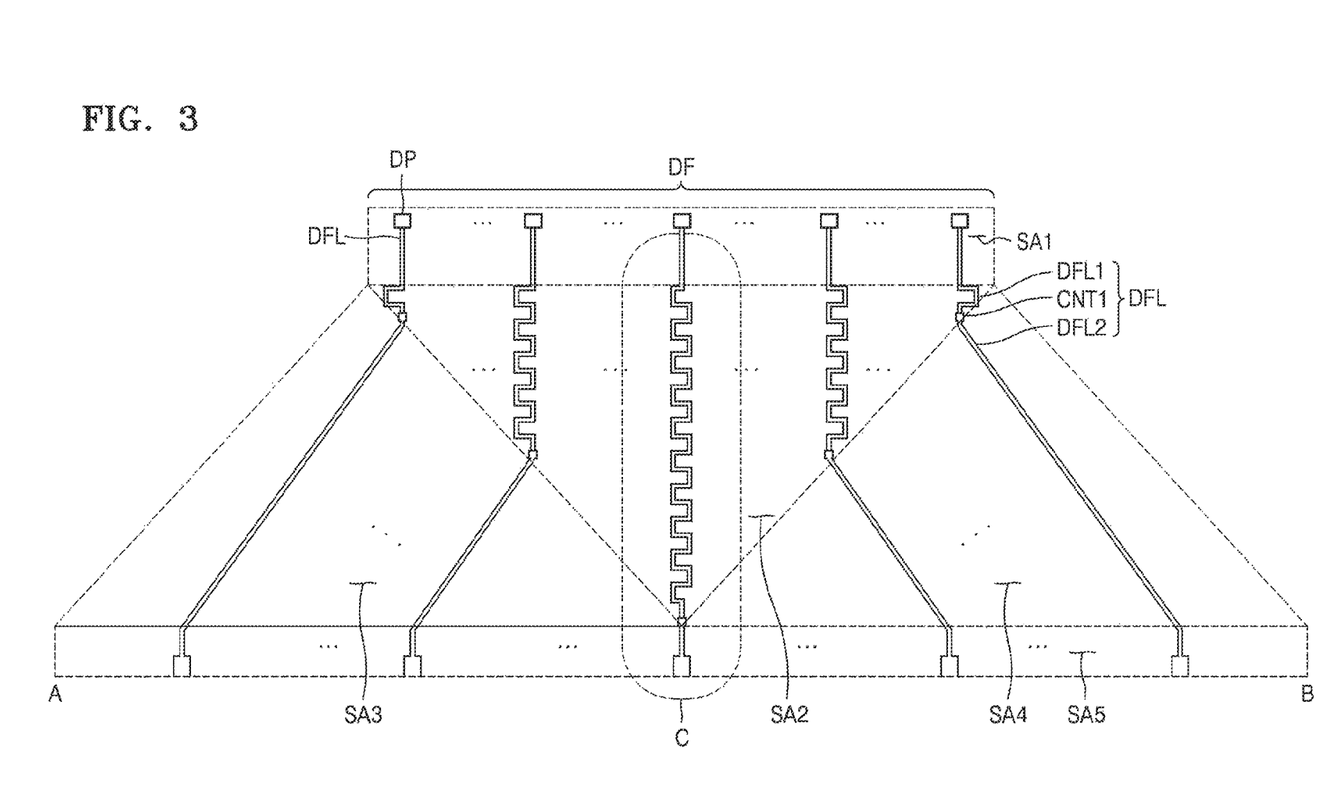
FIG. 3 is a schematic plan view of a fan-out portion of the array substrate of FIG. 1, according to one or more exemplary embodiments.
Figure 4:
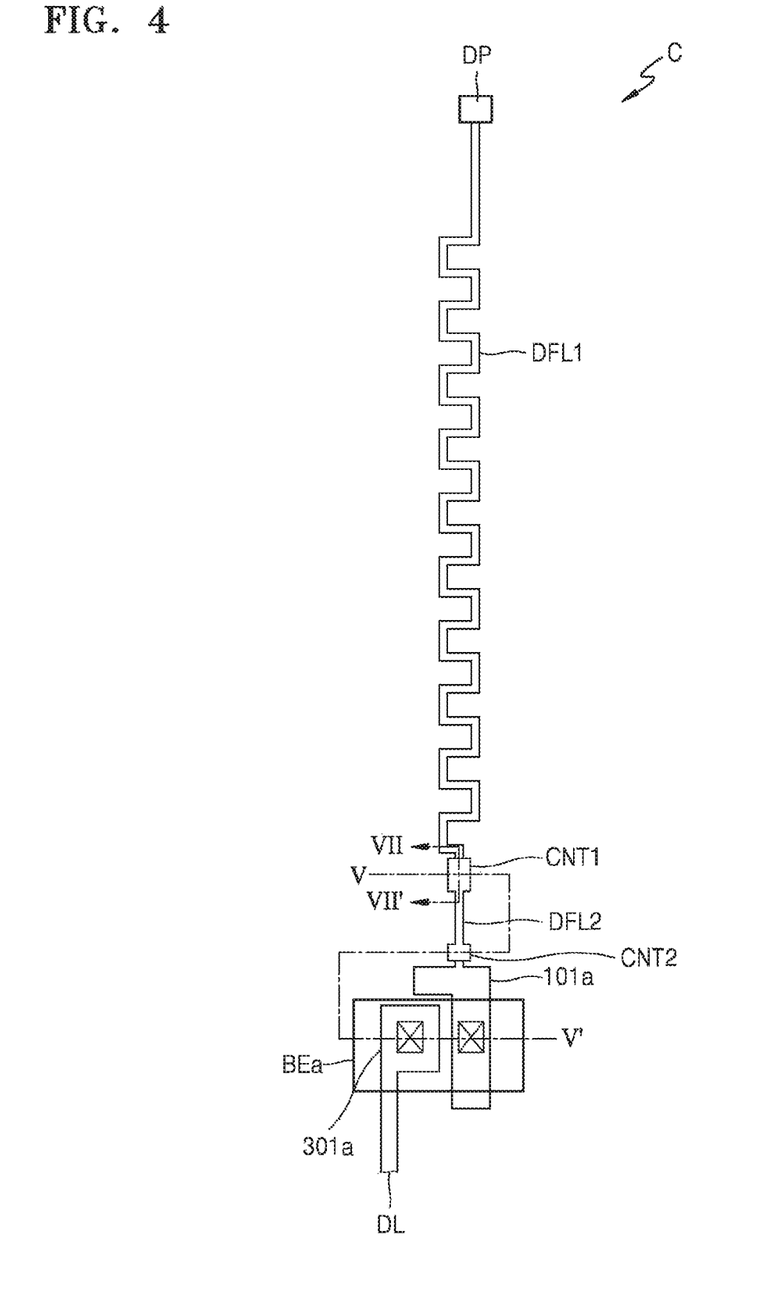
FIG. 4 is a schematic plan view of an enlarged portion of region C of FIG. 3, according to one or more exemplary embodiments.
Figure 5:
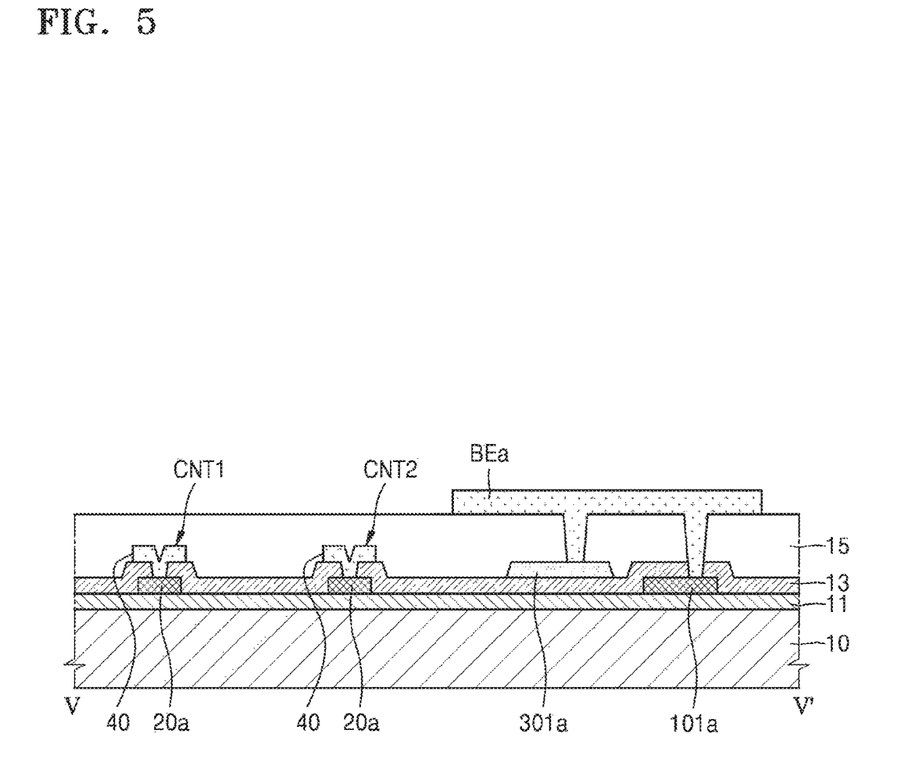
FIG. 5 is a schematic cross-sectional view of the array substrate of FIG. 4 taken along sectional line V-V', according to one or more exemplary embodiments.
Figure 6:
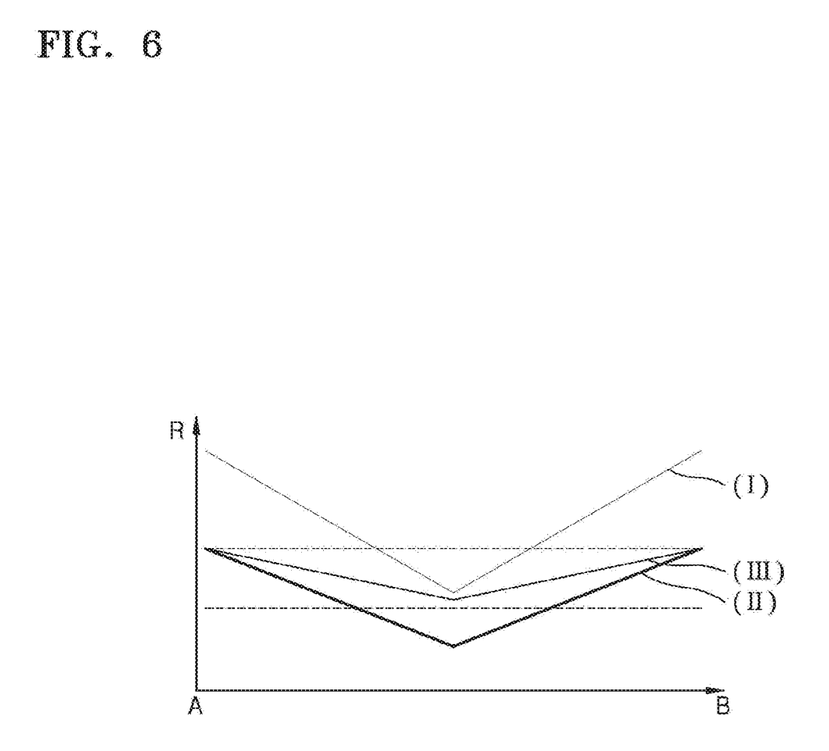
FIG. 6 is a diagram of a variation in resistances of fan-out lines in a fan-out portion of the array substrate of FIG. 3 according to a location of a fan-out line in the fan-out portion, according to one or more exemplary embodiments.

FIG. 3 is a schematic plan view of a data fan-out portion DF of the array substrate of FIG. 1, according one or more exemplary embodiments. FIG. 4 is a schematic plan view of an enlarged region C of FIG. 3. FIG. 5 is a schematic cross-sectional view of the array substrate of FIG. 4 taken along sectional line V-V of FIG. 4, and FIG. 6 is a schematic diagram of a variation in resistances of the fan-out lines in a fan-out portion of the array substrate of FIG. 3, according to one or more exemplary embodiments.

Referring to FIGS. 3 to 5, the plurality of data fan-out lines DFL may be arranged on the data fan-out portion DF. An end of each of the plurality of data fan-out lines DFL is connected to the data pad DP, and the other end of each of the data fan-out lines DFL is connected to a corresponding data line of the data lines DL1 to DLm. Each of the data fan-out lines DFL supplies a data signal to a corresponding data line of the data lines DL1 to DLm.

The data fan-out lines DFL may be spaced apart from each other in a data fan-out region. The data fan-out region may include a pad portion SA1, a contact portion SA5, a first region SA2, and second regions SA3 and SA4. The plurality of data pads DP may be arranged on the pad portion SA1, and a driving integrated circuit (not shown) including a data driver is mounted on the pad portion SA1. In addition, the contact portion SA5 is more adjacent to the display area DA than the pad portion SA1. The first region SA2 and the second regions SA3 and SA4 are disposed between the pad portion SA1 and the contact portion SA5. The second regions SA3 and SA4 are formed as adjacent triangles, illustrated in FIG. 3 as dashed lines. The first region SA2 is defined by the pad portion SA1 and the second regions SA3 and SA4. In this manner, the first region SA2 has an inverted triangular shape. On the pad portion SA1, the data fan-out lines DFL are connected to the data pads DP at constant intervals therebetween, and the data fan-out lines DFL are formed in straight (or substantially straight) lines.

The data fan-out lines DFL extend from the pad portion SA1 to the first region SA2. In the first region SA2, the data fan-out lines DFL are arranged at constant intervals therebetween. Intervals between the data pads DP are less than intervals between the data lines DL in the display area DA. In this manner, lengths of the data fan-out lines DFL connecting the data pads DP to the data lines DL may vary. As such, there may be a variation in resistances of the data fan-out lines DFL.

To reduce the variation between the lengths of the data fan-out lines DFL, each of the data fan-out lines DFL may have a pattern DFL1 in the first region SA2. For example, the pattern DFL1 may be a zigzag (or serpentine) pattern, however, any other suitable pattern may be utilized in association with exemplary embodiments described herein. In addition, the number of zigzag patterns may increase from the edges of the first region SA2 toward a center of the first region SA2 to reduce the resistance of the pattern DFL1 from the center toward the edges of the fan-out portion. In this manner, the variation in the resistances of the data fan-out lines DFL may be compensated. The pattern DFL1 may include a first conductive layer 20a formed at the same layer and including the same material as the gate lines GL1 to GLn.

The data fan-out lines DFL extend from the first region SA2 to the second regions SA3 and SA4. The data fan-out lines DFL include straight portions DFL2 that extend in oblique directions and are spaced apart from each other in the second regions SA3 and SA4. Intervals between the straight portions DFL2 in the second regions SA3 and SA4 increase toward the data lines DL, and lengths of the straight portions DFL2 may increase from the center of the fan-out portion toward the edges of the fan-out portion. Each of the straight portions DFL2 may further include a second conductive layer 40 overlaid on the first conductive layer 20a with an insulating layer (e.g., first insulating layer 13) disposed therebetween. The second conductive layer 40 may be formed at the same layer and include the same material as the data lines DL1 to DLm, and may be connected to the first conductive layer 20a in parallel. In this manner, a resistance of the straight portion DFL2 may be reduced.

The second conductive layer 40 may be electrically connected to the first conductive layer 20a via a contact. For example, the contact may include a first contact CNT1 connecting an end of the second conductive layer 40 to the first conductive layer 20a, and a second contact CNT2 connecting the other end of the second conductive layer 40 to the first conductive layer 20a. The first contact CNT1 may be located at a boundary between the pattern DFL1 and the straight portion DFL2. In this manner, the first contact CNT1 may approach the data pad DP toward the edges of the data fan-out portion DF. As such, a length of the second conductive layer 40 connected to the first conductive layer 20a in parallel may increase from the center toward the edges of the contact portion SA5. Accordingly, from the center toward the edges of the contact portion SA5, a reduction in the resistance of the straight portion DFL2 in which the first conductive layer 20a and the second conductive layer 40 are connected in parallel is increased. To this end, a variation in resistances of the data fan-out lines DFL may be further reduced.

According to one or more exemplary embodiments, the data fan-out lines DFL extend from the second regions SA3 and SA4 to the contact portion SA5, and are connected to the data lines DL in the contact portion SA5. An expansion 101a having a greater width than the other parts may be formed at the other end of each data fan-out line DFL, and the expansion 101a may be electrically connected to an expansion 301a of the data line DL via a bridge electrode BEa.

FIG. 6 is a diagram of a variation in resistances of fan-out lines in a fan-out portion of the array substrate of FIG. 3 according to a location of a fan-out line in the fan-out portion, according to one or more exemplary embodiments.

In FIG. 6, line (I) denotes the resistance of an example in which the pattern DFL1 and the straight portion DFL2 only include the first conductive layer 20a, line (II) denotes the resistance of an example in which the pattern DFL1 and the straight portion DFL1 both include a stacked structure of the first conductive layer 20a and the second conductive layer 40, and line (III) denotes the resistance of an example in which the pattern DFL1 includes the first conductive layer 20a and the straight portion DFL2 includes a stacked structure of the first conductive layer 20a and the second conductive layer 40 (as in the exemplary embodiments described herein).

As seen in the diagram of FIG. 6, according to line (II), the resistance R of the data fan-out lines DFL is reduced from than that of line (I), but a difference between the resistances R of the data fan-out lines DFL at the center and edges A and B of the data fan-out portion is relatively large. According to the line (III), the first contact CNT1 is disposed between the pattern DFL1 and the straight portion DFL2, and the length of the straight portion DFL2 including the stacked structure of the first conductive layer 20a and the second conductive layer 40 increases toward the edges A and B of the data fan-out portion. In this manner, a resistance R value of the data fan-out line DFL at the center of the data fan-out portion (e.g., a minimum resistance R value) is similar to that of line (I), and a resistance R value of the data fan-out line DFL at the edges A and B of the data fan-out portion (e.g., a maximum resistance R value) is similar to that of line (II). Accordingly, even when the area of the fan-out portion is reduced as the peripheral area PA of a display apparatus is reduced, a variation in resistances R of the data fan-out lines DFL may be reduced, as may be the resistances R of the gate fan-out lines GFL.

Figure 7:
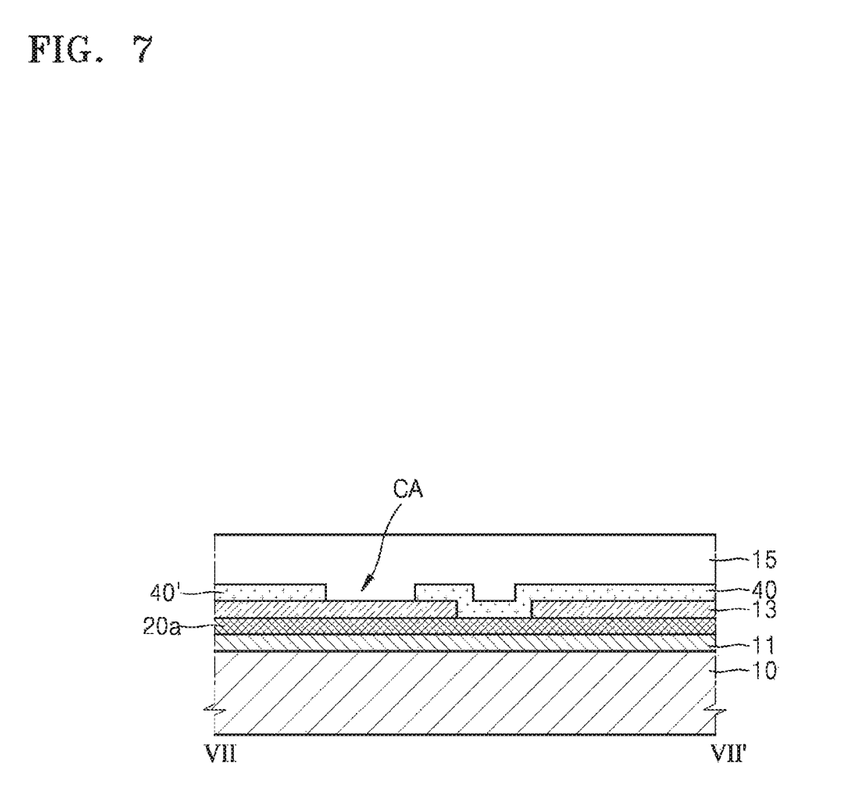
FIG. 7 is a schematic cross-sectional view of the array substrate of FIG. 4 taken along sectional line VII-VII', according to one or more exemplary embodiments.

FIG. 7 is a schematic cross-sectional view of the array substrate of FIG. 4 taken along sectional line VII-VII', according to one or more exemplary embodiments. It is noted that FIG. 7 shows a cross-sectional view taken along sectional line VII-VII' of FIG. 4 for descriptive convenience, but corresponds to a modified example of the substrate 10 of FIG. 1. Hereinafter, a data fan-out portion DF of FIG. 7 will be described with reference to FIGS. 3, 4, and 7.

Referring to FIGS. 3, 4, and 7, each of the data fan-out lines DFL on the buffer layer 11 may include the pattern DFL1 connected to the data pad DP, the straight portion DFL2 connected to the data line DL, and the first contact CNT1 located at a boundary between the pattern DFL1 and the straight portion DFL2. The pattern DFL1 includes the first conductive layer 20a, and the straight portion DFL2 may include the first conductive layer 20a and the second conductive layer 40 that are connected to each other in parallel with the first insulating layer 13 disposed therebetween.

The first contact CNT1 may be located at the boundary between the pattern DFL1 and the straight portion DFL2. That is, a location of the first contact CNT1 is more adjacent to the data pad DP toward the edges of the data fan-out portion DF from the center portion. In this manner, a variation in resistances of the data fan-out lines DFL may be reduced.

In addition, each of the data fan-out portions DFL may further include a third conductive layer 40' overlapping the first conductive layer 20a with the first insulating layer 13 disposed therebetween. The third conductive layer 40' is in a floating state to be insulated from the data fan-out lines DFL. The third conductive layer 40' may be formed at the same layer and including the same material as the second conductive layer 40. It is noted, however, that the third conductive layer 40' is isolated from the second conductive layer 40 due to a cut area CA, and, as such, the third conductive layer 40' may be considered a dummy electrode.

As described above, when each of the data fan-out lines DFL includes the third conductive layer 40', heights of the data fan-out lines DFL may be uniformed. As such, when a seal (not shown) for bonding the substrate 10 to another substrate to manufacture a display apparatus, uniformity in a seal gap may be improved. In addition, since the third conductive layer 40' is formed to overlap the first conductive layer 20a, when a defect (such as a short-circuit) occurs in the first conductive layer 20a, the third conductive layer 40' may repair the first conductive layer 20a. As such, manufacturing efficiency of the substrate 10 may be improved.

According to exemplary embodiments, variation in resistances of the fan-out lines in the fan-out portions may be reduced even when the areas of the fan-out portions decrease.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An array substrate comprising:
    a surface;
    a plurality of signal lines disposed on the surface in a display area;
    a plurality of signal pads disposed on the surface in a non-display area; and
    a fan-out portion disposed on the surface in the non-display area, the fan-out portion comprising a plurality of fan-out lines connecting the plurality of signal lines to the plurality of signal pads,
    wherein each of the plurality of fan-out lines comprises:
        a pattern electrically connected to a corresponding signal pad of the plurality of signal pads; and
        a straight portion electrically connected to a corresponding signal line of the plurality of signal lines,
    wherein the pattern comprises a first conductive layer and a third conductive layer disposed on the first conductive layer, the third conductive layer comprising a dummy electrode,
    wherein the straight portion comprises the first conductive layer and a second conductive layer disposed on the first conductive layer, the third conductive layer being, in a lateral direction, spaced apart from the straight portion at a transition between the pattern and the straight portion, and
    wherein a thickness of the pattern between the first conductive layer and the third conductive layer is equivalent to a thickness of the straight portion between the first conductive layer and the second conductive layer.

2. The array substrate of claim 1, wherein:
an insulating layer is disposed between the first conductive layer and the second conductive layer; and
the second conductive layer is electrically connected to the first conductive layer via a contact.

3. The array substrate of claim 2, wherein:
the contact comprises:
   a first contact connecting a first end of the second conductive layer to the first conductive layer; and
   a second contact connecting a second end of the second conductive layer to the first conductive layer; and
in the straight portion, the first conductive layer and the second conductive layer are connected in parallel.

4. The array substrate of claim 3, wherein:
the first contact is disposed at a boundary between the pattern and the straight portion; and
a location of the first contact becomes closer to a corresponding signal pad of the plurality of signal pads from a center portion of the fan-out portion toward edges of the fan-out portion.

5. The array substrate of claim 1, wherein resistances of the patterns reduce from a center portion of the fan-out portion toward edges of the fan-out portion.

6. The array substrate of claim 1, wherein lengths of the straight portions increase from a center portion of the fan-out portion toward edges of the fan-out portion.

7. The array substrate of claim 1, wherein:
the fan-out portion comprises:
   a first region in which the plurality of fan-out lines are spaced from one another at a constant interval; and
   a second region in which the plurality of fan-out lines are spaced from one another at gradually reducing intervals;
the pattern is disposed in the first region; and
the straight portion is disposed in the second region.

8. The array substrate of claim 1, wherein:
the plurality of signal lines comprise:
   a plurality of gate lines extending in a first direction; and
   a plurality of data lines extending in a second direction crossing the first direction;
the first conductive layer is disposed at a same layer as the plurality of gate lines; and
the second conductive layer is disposed at a same layer as the plurality of data lines.

9. The array substrate of claim 1, wherein each of the plurality of fan-out portions further comprises an insulating layer disposed between the third conductive layer and the first conductive layer.

10. The array substrate of claim 9, wherein:
the insulating layer is disposed between the second conductive layer and the first conductive layer; and
the second conductive layer and the third conductive layer are located at the same layer as one another and are isolated from one another.

11. An array substrate comprising:
a surface;
a plurality of signal lines disposed on the surface in a display area;
a plurality of signal pads disposed on the surface in a non-display area; and
a fan-out portion disposed on the surface in the non-display area, the fan-out portion comprising a plurality of fan-out lines connecting the plurality of signal lines to the plurality of signal pads,
wherein each of the plurality of fan-out lines comprises:
   a first area comprising a pattern electrically connected to a corresponding signal pad of the plurality of signal pads;
   a second area adjacent to the first area, the second area comprising a straight portion electrically connected to a corresponding signal line of the plurality of signal lines;
   an electrically floating electrode overlapping a portion of the first area, the electrically floating electrode being spaced apart from the straight portion in a lateral direction; and
   a first contact disposed at a boundary between the first area and the second area, the first contact electrically connecting the pattern and the straight portion,
wherein the array substrate further comprises:
   a first insulating layer overlapping the electrically floating electrode, the first area, and the second area; and
   bridge electrodes disposed on the first insulating layer, the first insulating layer being disposed between the bridge electrodes and the surface,
wherein, in a direction normal to the surface, the electrically floating electrode is disposed between the first insulating layer and the pattern,
wherein each bridge electrode of the bridge electrodes electrically connects a corresponding signal line of the plurality of signal lines to a corresponding straight portion of the straight portions of the plurality of fan-out lines, and
wherein a distance between the first contact and the corresponding signal pad reduces with increasing distance from a center portion of the fan-out portion.

12. The array substrate of claim 11, wherein:
the pattern comprises a first conductive layer; and
the straight portion comprises the first conductive layer and a second conductive layer disposed on the first conductive layer.

13. The array substrate of claim 12, further comprising:
a second insulating layer disposed between the first conductive layer and the second conductive layer,
wherein the first contact connects a first end of the second conductive layer to the first conductive layer, and
wherein each of the plurality of fan-out lines further comprises a second contact connecting a second end of the second conductive layer to the first conductive layer.

14. The array substrate of claim 13, wherein each of the second contacts is disposed along a same imaginary line.

15. The array substrate of claim 12, wherein resistances of the patterns reduce from the center portion of the fan-out portion toward edges of the fan-out portion.

16. The array substrate of claim 12, wherein lengths of the straight portions increase from the center portion toward edges of the fan-out portion.

17. The array substrate of claim 12, wherein:
the plurality of fan-out lines are spaced from one another at gradually reducing intervals in a first region;
the plurality of fan-out lines are spaced from one another at a constant interval in a second region;
the straight portion is disposed in the first region; and
the pattern is disposed in the second region.

18. The array substrate of claim 12, wherein:
the plurality of signal lines comprise:
   a plurality of gate lines extending in a first direction; and
   a plurality of data lines extending in a second direction crossing the first direction;

the first conductive layer is disposed at a same layer as the plurality of gate lines; and the second conductive layer is disposed at a same layer as the plurality of data lines.

19. The array substrate of claim 12, wherein each of the plurality of fan-out portions further comprises a second insulating layer disposed between the electrically floating electrode and the first conductive layer.

20. The array substrate of claim 19, wherein:

the second insulating layer is disposed between the second conductive layer and the first conductive layer; and the second conductive layer and the electrically floating electrode are disposed at a same layer as one another and are isolated from one another.

* * * * *